US012339591B2

(12) United States Patent
Huang et al.

(10) Patent No.: US 12,339,591 B2
(45) Date of Patent: Jun. 24, 2025

(54) DETERMINING METRICS FOR A PORTION OF A PATTERN ON A SUBSTRATE

(71) Applicant: ASML NETHERLANDS B.V., Veldhoven (NL)

(72) Inventors: Jiao Huang, Shenzhen (CN); Yunan Zheng, Fremont, CA (US); Qian Zhao, San Jose, CA (US); Jiao Liang, San Jose, CA (US); Yongfa Fan, Sunnyvale, CA (US); Mu Feng, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 272 days.

(21) Appl. No.: 17/919,189

(22) PCT Filed: May 7, 2021

(86) PCT No.: PCT/EP2021/062227
§ 371 (c)(1),
(2) Date: Oct. 14, 2022

(87) PCT Pub. No.: WO2021/228725
PCT Pub. Date: Nov. 18, 2021

(65) Prior Publication Data
US 2023/0161269 A1 May 25, 2023

(30) Foreign Application Priority Data

May 9, 2020 (WO) ............... PCT/CN2020/089387

(51) Int. Cl.
*G03F 7/00* (2006.01)
*G06T 7/11* (2017.01)
(52) U.S. Cl.
CPC ...... *G03F 7/70633* (2013.01); *G03F 7/70625* (2013.01); *G06T 7/11* (2017.01); *G06T 2207/10061* (2013.01)

(58) Field of Classification Search
CPC ............. G03F 7/70633; G03F 7/70625; G03F 7/70466; G06T 7/11; G06T 2207/10061
See application file for complete search history.

(56) References Cited

U.S. PATENT DOCUMENTS 5,229,872 A 7/1993 Mumola
6,046,792 A 4/2000 Van Der Werf et al.
(Continued)

FOREIGN PATENT DOCUMENTS

CN 1698014 11/2005
KR 10-1999-0074639 10/1999
(Continued)

OTHER PUBLICATIONS

International Search Report and Written Opinion dated Aug. 11, 2021, issued in the International Application No. PCT/EP2021/062227 filed May 7, 2021.
(Continued)

*Primary Examiner* — Hung V Nguyen
(74) *Attorney, Agent, or Firm* — Pillsbury Winthrop Shaw Pittman LLP

(57) ABSTRACT

Systems and methods for determining one or more characteristic metrics for a portion of a pattern on a substrate are described. Pattern information for the pattern on the substrate is received. The pattern on the substrate has first and second portions. The first portion of the pattern is blocked, for example with a geometrical block mask, based on the pattern information, such that the second portion of the pattern remains unblocked. The one or more metrics are determined for the unblocked second portion of the pattern. In some embodiments, the first and second portions of the pattern correspond to different exposures in a semiconductor lithography process. The semiconductor lithography process may be a multiple patterning technology process, for
(Continued)

example, such as a double patterning process, a triple patterning process, or a spacer double patterning process.

20 Claims, 16 Drawing Sheets

(56) References Cited

U.S. PATENT DOCUMENTS

| | | | |
|---|---|---|---|
| 7,477,772 B2* | 1/2009 | Makarovic | G03F 7/70508 |
| | | | 382/303 |
| 9,588,438 B2 | 3/2017 | Hsu et al. | |
| 9,892,500 B2* | 2/2018 | Lee | G06T 7/0004 |
| 11,681,229 B2* | 6/2023 | Van Der Laan | G03F 7/70608 |
| | | | 716/51 |
| 11,860,549 B2* | 1/2024 | Siemons | G03F 7/70475 |
| 2006/0269116 A1 | 11/2006 | Makarovic et al. | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0092931 A1 | 4/2009 | Kang et al. | |
| 2009/0157630 A1 | 6/2009 | Yuan | |
| 2010/0162197 A1 | 6/2010 | Ye et al. | |
| 2010/0180251 A1 | 7/2010 | Ye | |
| 2013/0242305 A1 | 9/2013 | Cohen | |
| 2016/0077517 A1 | 3/2016 | Lee et al. | |
| 2016/0377425 A1 | 12/2016 | Gupta et al. | |
| 2017/0363970 A1 | 12/2017 | Cohen et al. | |

FOREIGN PATENT DOCUMENTS

| | | | |
|---|---|---|---|
| KR | 10-2014-0132405 | 11/2014 | |
| KR | 10-2015-0048380 | 5/2015 | |
| TW | 201602733 | 1/2016 | |
| WO | 2013/134487 | 9/2013 | |
| WO | WO-2013134487 A1 * | 9/2013 | G03F 7/70633 |

OTHER PUBLICATIONS

C. Spence, "Full-Chip Lithography Simulation and Design Analysis—How OPC Is Changing IC Design", Proc. SPIE, vol. 5751, pp. 1-14 (2005).

Office Action dated Mar. 22, 2022, issued in the corresponding Taiwan Patent Application No. 110116520.

Korean Office Action issued in corresponding Korean Patent Application No. 10-2022-7039152 dated Aug. 8, 2024.

* cited by examiner

DETERMINING METRICS FOR A PORTION OF A PATTERN ON A SUBSTRATE

CROSS-REFERENCE TO RELATED APPLICATIONS

This application is a U.S. national phase entry of PCT Patent Application No. PCT/EP2021/062227 which was filed on Jul. 5, 2021, which claims priority of PCT application PCT/CN2020/089387 which was filed on May 9, 2020 and which is incorporated herein in its entirety by reference.

TECHNICAL FIELD

The present description relates to determining characteristic metrics for a pattern on a substrate.

BACKGROUND

A lithographic projection apparatus can be used, for example, in the manufacture of integrated circuits (ICs). A patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction features the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After one or more exposures, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

Lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula CD (critical dimension)=$k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

SUMMARY

According to an embodiment, there is provided a method for determining one or more metrics for a portion of a pattern on a substrate. The method comprises receiving pattern information for the pattern on the substrate. The pattern on the substrate has first and second portions. The method comprises blocking, based on the pattern information, the first portion of the pattern such that the second portion of the pattern remains unblocked; and determining the one or more metrics for the unblocked second portion of the pattern.

In some embodiments, the one or more metrics comprise a critical dimension and/or edge placement error.

In some embodiments, determining the one or more metrics for the unblocked second portion comprises: aligning and averaging images of the pattern on the substrate; performing contour extraction on an averaged image; and aligning an extracted contour with the pattern information for the pattern on the substrate. The aligning is performed for both portions of the pattern, including the blocked first portion and unblocked second portion. In some embodiments, determining the one or more metrics for the unblocked second portion further comprises: generating one or more gauges in the contour for the unblocked second portion of the pattern; and measuring the one or more gauges. The one or more gauges specify the one or more metrics for the unblocked second portion.

In some embodiments, the first and second portions of the pattern are merged, and the images are scanning electron microscope (SEM) images comprising the merged first and second portions of the pattern on the substrate. In some embodiments, determining the one or more metrics for the unblocked second portion comprises decomposing the first and second portions of the pattern in the SEM images.

In some embodiments, blocking comprises generating a geometrical block mask for the first portion based on the pattern information.

In some embodiments, the pattern information specifies geometry of the first portion of the pattern. Generating the mask comprises biasing the geometry of the first portion larger or smaller relative to the geometry of the first portion specified in the pattern information.

In some embodiments, the pattern information specifies geometry of the first portion of the pattern, and generating the mask comprises generating a first mask area by biasing the geometry of the first portion larger relative to the geometry of the first portion specified in the pattern information, generating a second mask area by biasing the geometry of the first portion smaller relative to the geometry of the first portion specified in the pattern information, and subtracting the second mask area from the first mask area to generate the mask.

In some embodiments, at least a portion of the mask is also formed by a cutting layer of the pattern.

In some embodiments, the first and second portions of the pattern are merged. The merged first and second portions of the pattern on the substrate correspond to different exposures in a semiconductor lithography process.

In some embodiments, the semiconductor lithography process is a multiple patterning technology process. In some embodiments, the multiple patterning technology process is a double patterning process, a triple patterning process, or a spacer double patterning process.

In some embodiments, the method further comprises adjusting a semiconductor manufacturing process based on the one or more metrics for the unblocked second portion.

In some embodiments, the adjusting comprises changing a dimension, a shape, and/or a location of a feature in the second portion of the pattern; and/or changing a mask, a dose, a focus, and/or an exposure associated with the second portion of the pattern.

In some embodiments, the method further comprises unblocking the first portion, based on the pattern information; blocking, based on the pattern information, the second portion such that the first portion remains unblocked; and determining, one or more metrics for the unblocked first portion.

According to another embodiment, there is provided a non-transitory computer readable medium having instructions thereon. The instructions, when executed by a computer, cause the computer to: receive pattern information for a pattern on a substrate, the pattern on the substrate having first and second portions; block, based on the pattern information, the first portion such that the second portion remains unblocked; and determine one or more metrics for the unblocked second portion.

In some embodiments, the one or more metrics comprise a critical dimension and/or edge placement error.

In some embodiments, determining the one or more metrics for the unblocked second portion comprises: aligning and averaging images of the pattern on the substrate; performing contour extraction on an averaged image; and aligning an extracted contour with the pattern information for the pattern on the substrate. The aligning is performed for both portions of the pattern, including the blocked first portion and unblocked second portion. In some embodiments, determining the one or more metrics for the unblocked second portion further comprises: generating one or more gauges in the contour for the unblocked second portion of the pattern; and measuring the one or more gauges, the one or more gauges specifying the one or more metrics for the unblocked second portion.

In some embodiments, the first and second portions of the pattern are merged, and the images are scanning electron microscope (SEM) images comprising the merged first and second portions of the pattern on the substrate. In some embodiments, determining the one or more metrics for the unblocked second portion comprises decomposing the first and second portions of the pattern in the SEM images.

In some embodiments, blocking comprises generating a geometrical block mask for the first portion based on the pattern information.

In some embodiments, the pattern information specifies geometry of the first portion of the pattern, and generating the mask comprises biasing the geometry of the first portion larger or smaller relative to the geometry of the first portion specified in the pattern information.

In some embodiments, the pattern information specifies geometry of the first portion of the pattern, and generating the mask comprises generating a first mask area by biasing the geometry of the first portion larger relative to the geometry of the first portion specified in the pattern information, generating a second mask area by biasing the geometry of the first portion smaller relative to the geometry of the first portion specified in the pattern information, and subtracting the second mask area from the first mask area to generate the mask.

In some embodiments, at least a portion of the mask is further formed by a cutting layer of the pattern.

In some embodiments, the first and second portions of the pattern on the substrate are merged and correspond to different exposures in a semiconductor lithography process. In some embodiments, the semiconductor lithography process is a multiple patterning technology process. In some embodiments, the multiple patterning technology process is a double patterning process, a triple patterning process, or a spacer double patterning process.

In some embodiments, the instructions are further configured to cause the computer to adjust a semiconductor manufacturing process based on the one or more metrics for the unblocked second portion.

In some embodiments, the adjusting comprises changing a dimension, a shape, and/or a location of a feature in the second portion of the pattern; and/or changing a mask, a dose, a focus, and/or an exposure associated with the second portion of the pattern.

In some embodiments, the instructions are further configured to cause the computer to: unblock the first portion based on the pattern information; block, based on the pattern information, the second portion such that the first portion remains unblocked; and determine one or more metrics for the unblocked first portion.

DETAILED DESCRIPTION

Figure 1:
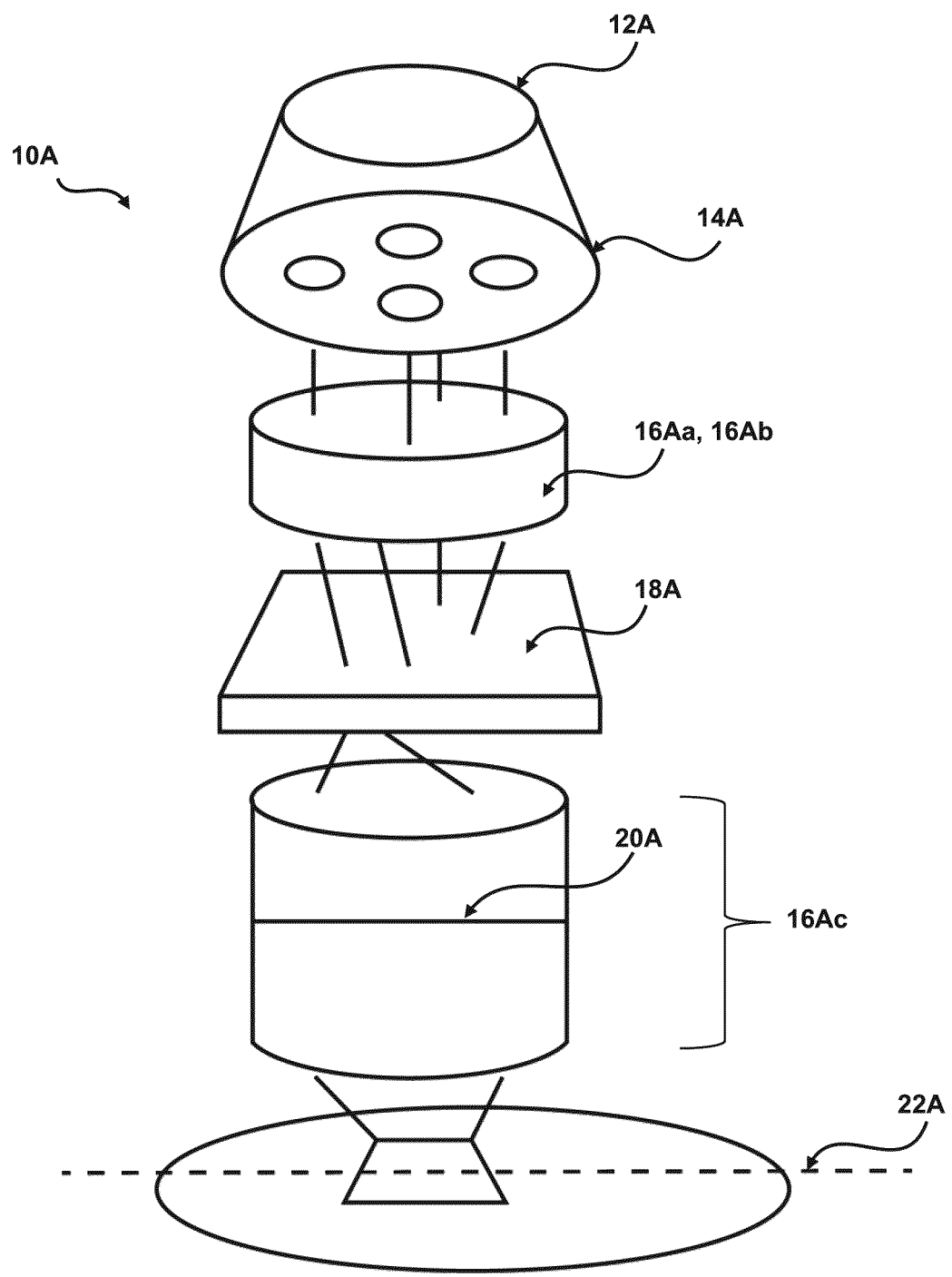
FIG. 1 shows a block diagram of various subsystems of a lithography system, according to an embodiment.

Multiple patterning technology (MPT), including double, triple, spacer double patterning, cutting layer, etc., is an effective way to decrease pattern feature spacing and improve the integration of features in semiconductor devices. MPT is widely used in advanced semiconductor manufacturing processes. Due to the complexity of MPT, accurate control of critical dimension (CD), edge placement (EP) (or edge placement error (EPE)), overlay, and/or other metrics is required for metrology and/or for simulation model calibration purposes. For example, MPT requires a high accuracy optical proximity correction (OPC) model for simulations configured to identify the weak points or defects in an integrated MPT design, and correct them.

Embodiments of the present disclosure are described in details with reference to SEM systems; however, the present disclosure is not limited to any particular type of metrology or inspection system used for scanning the wafer and generating signal for measuring the patterns, as described below. In some embodiments, scanning electron microscope images (SEM) of substrates are used to generate the metrology data in an MPT process. An SEM image of a substrate from an MPT process is an image of merged portions of an MPT pattern in the substrate. However, separate metrology data is desired for each of the individual merged portions of a pattern (e.g., with individual pattern portions resulting from different processes in the MPT process flow), e.g., to characterize an individual portion of the pattern. It is desired that separate metrology data be generated for an individual portion of the pattern without interference from the other merged portions of the pattern. Conventionally, a commonly used solution to generate the metrology data for individual portions of the pattern comprises manually measuring the required metrics (e.g., CD, EP, overlay, EPE, and etc.), one by one, for each individual portion of the pattern. The person performing the measuring manually determines which features belong to which individual portion of the pattern in an SEM image, and measures the required metrics accordingly.

There are many disadvantages of manually measuring the required metrics, one by one, for individual portions of a pattern. Manual measurements are not efficient, and the total measurement turnaround time is very long. To get an accurate model, thousands of measurements are necessary to perform a model calibration. For example, there may be 5000 measurements required for each individual portion of a pattern in a double patterning process. It may take about ten seconds to perform one measurement. This measurement time will further increase with additional individual portions of a pattern. As another example, when several individual portions of a pattern are merged in an MPT process, it may be difficult to even manually identify which features in a substrate belong to which portions of a pattern. This may cause errors in measurement and decrease model accuracy. As a third example, many desired measurements including CD measurements in critical locations for one portion of the pattern may be prevented by the features of a different portion of the pattern. This can lead to model overfitting and decreased accuracy.

Advantageously, embodiments of the presently disclosed systems and methods are configured for accurately and automatically determining metrics for separate portions of a pattern on a substrate. The determined metrics may be used to build and/or verify an OPC model, and/or for other purposes. Pattern information specifying geometry for the pattern on the substrate is received and used to block a first portion of the pattern. The blocking may be performed, for example, with a geometrical block mask, such that a second portion of the pattern remains unblocked and can be measured without interference from the first portion of the pattern. The masking and measuring may be repeated for any number of portions of the pattern. Compared to the manual process described above, the present technique saves time and is more accurate because the blocking facilitates automated measurements. For example, manual decision making between features is not needed because features not belonging to a measured pattern are blocked. In addition, compared to traditional manual metrology, which only measures CD, embodiments of the present systems and methods are configured to output both CD and edge placement (EP) (or edge placement error (EPE)). This means that measurement information at positions which cannot be used to generate a CD measurement can be supplemented with EP (or EPE), and improve the accuracy of a corresponding OPC model.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The term "mask", "reticle", or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example is given in U.S. Pat. No. 5,229,872, which is incorporated herein by reference.

In the present document, the terms "radiation" and "beam" may be used to encompass different types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). In general, multiple patterning technology processes use deep ultra violet (DUV) radiation, though it may be feasible for one of ordinary skill in the art to apply the principles described herein for other types of radiation.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As a brief introduction, FIG. 1 illustrates an exemplary lithographic projection apparatus 10A. Major components are a radiation source 12A, which may be a deep-ultraviolet (DUV) excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that shape radiation from radiation source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device (e.g., mask), onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device (e.g., mask) used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply optical proximity correction (OPC) using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

One aspect of understanding a lithographic process is understanding the interaction of the radiation and the patterning device (e.g., mask). The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
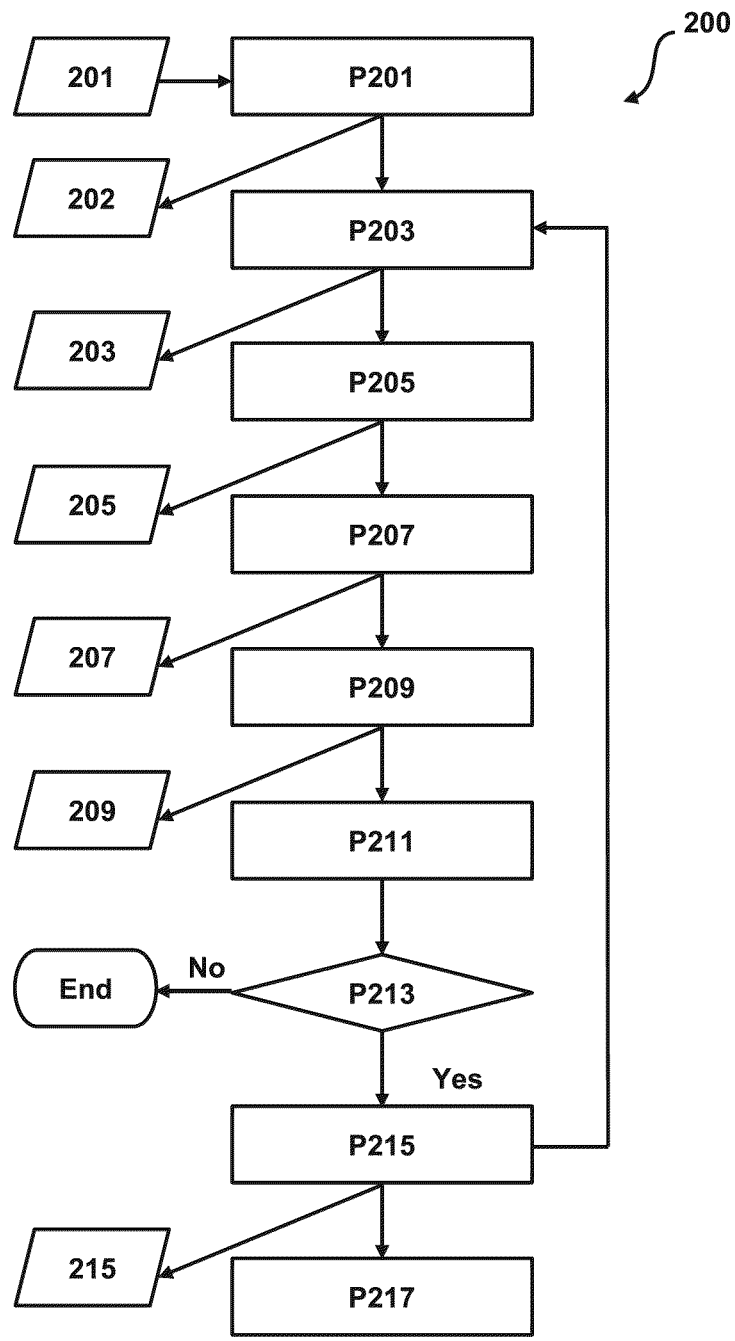
FIG. 2 is flow chart of a method for determining a patterning device pattern or a target pattern to be printed on a substrate, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate information comprising mask patterns or an image (e.g., a mask variables corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a BINARIZED CTM process, where an initial image is an optimized CTM image which is further processed according to the present disclosure to generate a curvilinear mask patterns (e.g., geometry or polygonal representation shapes of a curvilinear mask or curvilinear pattern). In an embodiment, the initial image may be the enhanced image of the CTM image). The curvilinear mask patterns may be in the form of a vector, a table, mathematical equations, or other forms of representing geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction. Such an initial image (e.g., the CTM image) may include one or more features (e.g., a feature of a target pattern, SRAFs, SRIFs, etc.) corresponding to the target pattern to be printed on the substrate via the patterning process.

In an embodiment, the CTM image (or an enhanced version of the CTM image) may be used to initialize the mask variables that can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location.

In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203, may involve generating mask variables 203 based on the enhanced image 202. In a first iteration, the enhanced image 202 may be used to initialize the mask variables 203. In later iterations the mask variables 203 may be updated iteratively.

A contour extraction of a real-valued function f of n real variables, is a set of the form:

$$L_c(f)=\{(x_1,x_2,\ldots,x_n)|f(x_1,x_2,\ldots,x_n)=c\}$$

In a two dimensional space, the set defines the points on the surface at which the function f equals to given value c. In a two dimensional space, the function f is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variables 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. A modified amplitude of the signals may enable generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generates tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask patterns. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern that may be printed on a substrate based on the mask image 207. For example, process P209 may involve executing and/or simulating the process model using the mask image 207 as input and generating a process image

209 on the substrate (e.g., an aerial image, a resist image, etch image, etc.). In an embodiment, the process model may include a mask transmission model coupled to an optics model which is further coupled to a resist model and/or etch model. The output of the process model may be a process image 209 that has factored in different process variations during the simulation process. The process image may be further used to determine parameters (e.g., edge placement error, critical dimension, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In process P211, a cost function may be evaluated based on the process image 209 (also referred as a simulated substrate image or substrate image or wafer image). Thus, the cost function may be considered as process aware, where variations of the patterning process, enabling generation of curvilinear mask patterns that account for variations in patterning process. For example, the cost function may be an edge placement error (EPE), sidelobe, a mean squared error (MSE), Pattern placement error (PPE), normalized image log or other appropriate variable defined based on the contour of the patterns in the process image. An EPE, as one example, may be an edge placement error associated with one or more patterns and/or a summation of all the edge placement errors related to all the patterns of the process model image 209 and the corresponding target patterns. In an embodiment, the cost function may include more than one condition that may be simultaneously reduced or minimized. For example, in addition to the MRC violation probability, the number of defects, EPE, overlay, CD or other parameter may be included and all the conditions may be simultaneously reduced (or minimized).

Furthermore, one or more gradient maps may be generated based on the cost function (e.g., EPE) and mask variables may be modified based on such gradient map(s). Mask variables (MV) refer to intensities of Ø. Accordingly, the gradient computation may be represented as dEPE/Ø, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed and a corresponding mask may be fabricated not only based on forward simulation of the patterning process, but also additionally based on manufacturing limitations of the mask manufacturing apparatus/process. Thus, a manufacturable curvilinear mask producing high yield (i e., minimum defects) and high accuracy in terms of, for example, EPE, CD, or overlay on the printed pattern may be obtained.

The pattern corresponding to a process image should be exactly the same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modify the mask variables 203

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of BINARIZED CTM results (i.e., a modified version of the enhanced image, mask image, or curvilinear mask).

In an embodiment of the present disclosure, the transition from CTM optimization with grayscale image to BINARIZED CTM optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final BINARIZED CTM image may be achieved allowing improved results in the final BINARIZED CTM optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

As lithography nodes keep shrinking, more and more complicated masks are required. The present method may be used in key layers with DUV scanners, and/or other scanners. The method according to the present disclosure may be included in different aspect of the mask optimization process including source mask optimization (SMO), mask optimization, and/or OPC.

For example, a prior art source mask optimization process is described in U.S. Pat. No. 9,588,438 titled "Optimization Flows of Source, Mask and Projection Optics", which is incorporated in its entirety by reference. This prior art source mask optimization process is performed for the center of a slit on a typical layout clip. The resulting optimization of the source and mask variables are considered representative of all positions on the slit (and/or other positions).

Optical proximity correction (OPC) enhances an integrated circuit patterning process by compensating for distortions that occur during processing. The distortions occur during processing because features printed on a wafer are smaller than the wavelengths of light used in the patterning and printing process. OPC verification identifies OPC errors or weak points in a post-OPC wafer design that could potentially lead to patterning defects on the wafer.

OPC addresses the fact that the final size and placement of an image of the design layout projected on the substrate will not be identical to, or simply depend only on the size and placement of the design layout on the patterning device. In the context of resolution enhancement techniques (RET) such as OPC, a physical patterning device is not necessarily used but a design layout can be used to represent a physical patterning device. For the small feature sizes and high feature densities present on some design layouts, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design, almost every feature of the design layout has some modification in order to achieve high fidelity of the projected image to the target design. These modifications may include shifting or biasing of edge positions or line widths as well as application of "assist" features that are intended to assist projection of other features.

In some embodiments, OPC may be based on measured metrics from actual or simulated images such as SEM images, for example, and/or other information. For example, CD, EP and/or EPE, overlay, and/or other metrics may be measured and provided to an OPC model as input for training, making predictions, and/or for other reasons.

As described above, multiple patterning technology (MPT) processes, including double, triple, spacer double patterning, cutting layer, etc., are effective at decreasing pattern feature spacing and improving the integration of features in semiconductor devices. For example, MPT requires a high accuracy OPC model for simulations configured to identify the weak points or defects in an integrated MPT design, and correct them. To build accurate OPC models, highly reliable metrology data is needed. An SEM image of a substrate from an MPT process is an image of an MPT pattern in the substrate. For example, the image is captured after the MPT pattern is fabricated following multiples steps of a sequence, e.g., including lithography, etch, lithography, etch and etch processes. That is, the image may include all or some of the portions of the MPT pattern. However, separate metrology data is needed for each of the individual portions of a pattern (e.g., with individual pattern portions corresponding to different process steps in the MPT process flow) to characterize an individual portion of the pattern and the associated process step. The separate metrology data needs to be generated for an individual portion of the pattern without interference from the other portions of the pattern.

In embodiments of the present systems and methods, pattern information specifying geometry for a pattern on a substrate is received and used to block a first portion of the pattern. The blocking may be performed, for example, with a geometrical block mask, such that a second portion of the pattern remains unblocked and can be measured without interference from the first portion of the pattern. The geometrical block mask may be generated based on the pattern design (e.g., the graphic data system (GDS) design or others) and/or die-to-database (D2DB) alignment process. The masking may be repeated for any number of portions of the pattern.

Figure 3:
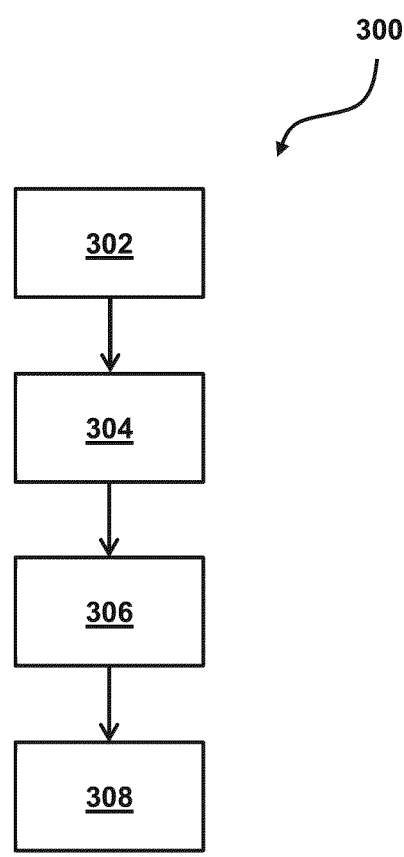
FIG. 3 illustrates an example of a present method for determining one or more metrics for a portion of a pattern on a substrate, according to an embodiment.

FIG. 3 illustrates an example of an exemplary method 300 for determining one or more metrics for a portion of a pattern on a substrate according to an embodiment of the present disclosure. Method 300 shown in FIG. 3 includes receiving 302 pattern information for a pattern on a substrate, blocking 304 a first portion of the pattern based on the pattern information such that a second portion of the pattern remains unblocked, and determining 306 the one or more metrics for the unblocked second portion of the pattern. In some embodiments, optionally adjusting 308 a semiconductor manufacturing process based on the one or metrics for the unblocked second portion, and/or other operations may be included in method 300.

The operations of method 300 are intended to be illustrative. In some embodiments, method 300 may be accomplished with one or more additional operations not described, and/or without one or more of the operations discussed. For example, in some embodiments, method 300 need not include adjusting operation 308. Additionally, the order in which the operations of method 300 are illustrated in FIG. 3 and described below is not intended to be limiting. In some embodiments, one or more portions of method 300 may be implemented (e.g., by simulation, modeling, etc.) in one or more processing devices. The one or more processing devices may include one or more devices executing some or all of the operations of method 300 in response to instructions stored electronically on an electronic storage medium. The one or more processing devices may include one or more devices configured through hardware, firmware, and/or software to be specifically designed for execution of one or more of the operations of method 300, for example.

It should be noted that although the examples descried below generally refer to a blocked first portion and an unblocked second portion of a pattern, method 300 may also include unblocking the first portion, based on the pattern information; blocking, based on the pattern information, the second portion such that the first portion remains unblocked; and determining, one or more metrics for the unblocked first portion. These operations may occur in succession or substantially in parallel. These principles of blocking and unblocking may also be extended to any number of portions of a pattern.

Receiving 302 comprises receiving pattern information for a pattern on a substrate. The pattern information may be communicated electronically (e.g., from one computing system to another, from one portion of a computing system to another portion of the computing system, etc.), and/or by other methods. The pattern on the substrate may already have a plurality of different portions. These portions may correspond to different process steps in the fabrication process flow (e.g., such as in an MPT process). For example, the pattern on the substrate may have first, second, third, fourth, fifth, etc., portions, and each portion corresponds to a process layer. These portions may be unique and/or may repeat one or more times throughout the pattern and/or across the substrate. For simplicity, the description herein focuses on just two different portions (e.g., a first portion and a second portion), but the principles described herein may be extended to any number of portions of a pattern.

The different portions may be or include different pattern designs within the overall pattern, and/or other portions. The pattern information specifies the geometry of the different pattern designs of the different portions of the pattern. The geometry may include feature shapes, feature dimensions, feature locations in a pattern, spacing between features, relative positions of features, etc., and/or other characteristics of the different pattern designs. The pattern information may be and/or include a GDS file that specifies the geometry of the individual portions of the pattern, and/or other types of information. By way of a non-limiting example, the pattern information may specify the geometry of the first portion of the pattern, the geometry of the second portion of the pattern, the geometry of the first and second portions relative to each other, and/or other information.

In some embodiments, the different portions are merged in the pattern on the substrate. Merged portions may include different portions that are positioned proximate to each other, intermingled features of different portions (e.g., a feature of one portion of the pattern positioned between, inside, and/or around one or more features of another portion of the pattern), features of different portions that touch or overlap (and/or appear to touch or overlap), and/or other merging. Continuing with the example above, the first and second portions of the pattern may be merged. As described above, in some embodiments, the merged portions of the pattern on the substrate may correspond to different process layers. For example, the merged first and second portions of the pattern on the substrate may correspond to first and second exposures in the semiconductor lithography process (e.g., an MPT process such as a double patterning process, a triple patterning process, a spacer double patterning process, and/or other processes).

In some embodiments, a metrology apparatus (or inspection equipment) is used to generate detected signals (e.g., capture an image) of the MDT pattern, including some or all of the portions of the MDT pattern. The apparatus may be an electron beam metrology apparatus or an optical metrology apparatus, configured to generate detected signals for measuring CD, EP, EPE, overlay and other metrics. According to the present disclosure, the metrology apparatus may acquire the raw signals or raw data. The raw signals or raw data is then measured and processed by an automated program either installed on the apparatus or on a separate computing device. The block masks may be applied in the measurement and data processing, either substantially concurrent with the raw data acquirement process, or in off-line data post processing.

Blocking 304 includes blocking a portion of the pattern such that another portion of the pattern remains unblocked. For example, the first portion of the pattern may be blocked such that the second portion of the pattern remains unblocked. As another example, a portion of a pattern may include various specifically designed metrology targets. In some embodiments, blocking 304 may include blocking one portion of a given metrology target, while leaving another portion of the metrology target unblocked.

The blocking is based on the pattern information and/or other information. Since the pattern information specifies the geometry of the different portions, the pattern information can be used to determine which portions of the overall pattern are separate (e.g., the first and second portions, different portions of a metrology target, etc.). Blocking one portion or another of the overall pattern can advantageously prevent that part of the pattern from interfering with measurements on the unblocked portion of the pattern (e.g., a blocked feature of one portion will not be accidentally used to measure a metric for a different unblocked portion of the pattern). Blocking one portion or another of the overall pattern facilitates automatic identification of measurement locations in the unblocked portion of the pattern by automated inspection process. For example, the automated inspection equipment may be programmed only to search in unblocked portions of a pattern design for features that are to be used to take measurements. Further for example, the automated inspection equipment will not accidentally capture a blocked feature that is in the same location as, or close to, target features for measurement.

In some embodiments, blocking 304 may comprise model simulation and complex GDS operations configured to generate block masks. The model simulation may generate a model contour for example, and/or for other purposes. The complex GDS operations may include a polygon Boolean operation, for example, and/or other complex GDS operations.

Figure 4:
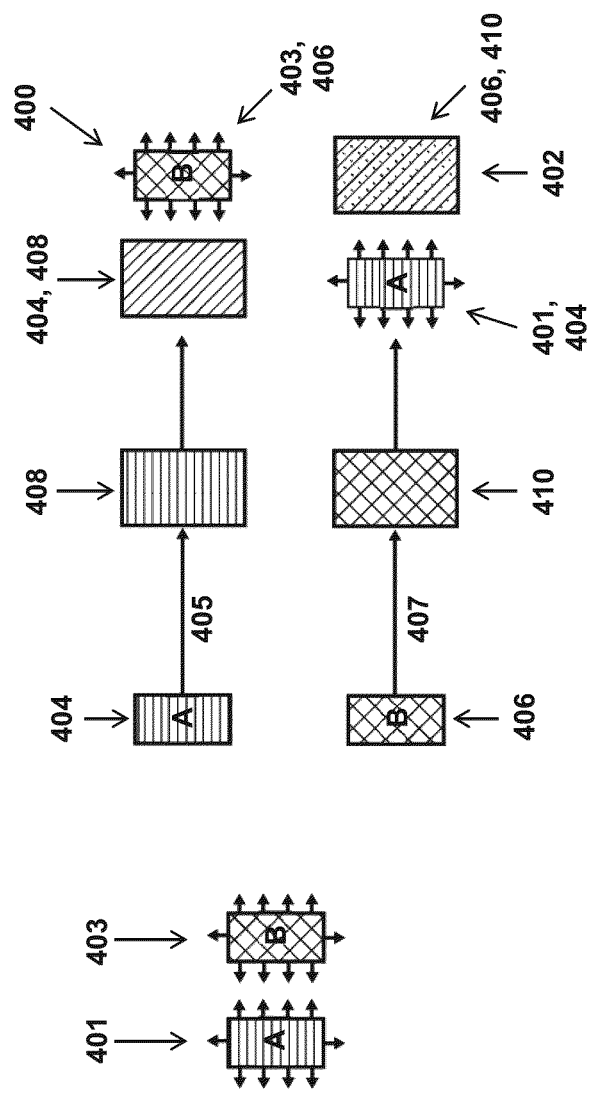
FIG. 4 illustrates blocking two different portions of a pattern by generating geometrical block masks for the different portions, according to an embodiment.

Blocking 304 comprises generating a geometrical block mask for a given portion (e.g., the first portion) of the pattern based on the pattern information and/or other information. The blocking locations and geometry can be determined based on the locations and geometry of the individual pattern portions, e.g., derived from the pattern design and D2DB alignment. For example, in some embodiments, generating the mask further comprises biasing the geometry of the portion that is to be blocked (e.g., the first portion in this example) larger or smaller relative to the geometry of that portion as specified in the pattern information. FIG. 4 illustrates blocking 400, 402 two different portions 404 (A), 406 (B) of a pattern that are located proximate to each other by generating geometrical block masks 408, 410 for the different portions 404, 406. In some embodiments, the GDS file and the D2DB alignment indicate the locations of the two portions. FIG. 4 shows measurement locations (as indicated by the arrows) that may be used to determine metrics for that portion of the pattern. These may be seed gauges 401, 403, for example. A seed gauge may be an initial location designated for a measurement. In some embodiments, other equivalent locations may be found nearby a seed gauge to perform more measurements. Seed gauges 401 and 403 may be located in proximity to each other in the pattern, for example. As shown in FIG. 4, the geometry of portion 404 is biased 405 larger to form mask 408 so that mask 408 can be used to block portion 404 and its associated seed gauge 401 (including the measurement locations shown by the arrows) to facilitate metric measurement for portion 406 and/or seed gauge 403. Similarly, the geometry of portion 406 can be biased 407 larger to form mask 410 so that mask 410 can be used to block portion 406/seed gauge 403 (including the measurement locations shown by the arrows) to facilitate metric measurement for portion 404 and/or seed gauge 401.

As another example, generating a mask may comprise generating a first mask area by biasing the geometry of a portion (e.g., the first portion) of a pattern larger relative to the geometry of that portion specified in the pattern information, generating a second mask area by biasing the geometry of that portion smaller relative to the geometry of that portion specified in the pattern information, and subtracting the second mask area from the first mask area to generate the mask. These biasing larger/smaller techniques, in combination addition and/or subtraction of biases from each other, may be used in combination to create masks of various shapes.

Figure 5:
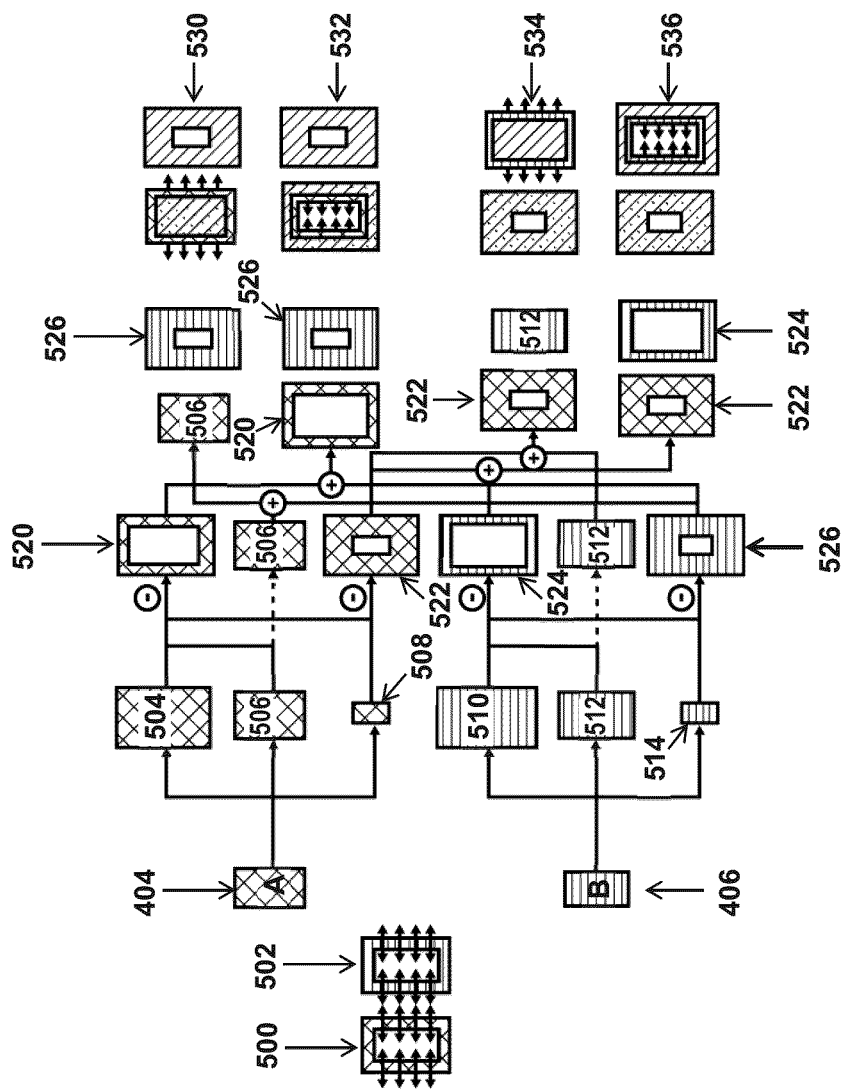
FIG. 5 illustrates creating masks of various shapes by biasing the geometry of first and second portions of a pattern in various ways, according to an embodiment.

For example, FIG. 5 illustrates creating exemplary masks of various shapes by biasing the geometry of first and second portions 404, 406 of a pattern in an embodiment of the present disclosure. Specifically, FIG. 5 illustrates the creation of example masks for a spacer double patterning process. FIG. 5 illustrates two seed gauges 500 (corresponding to portion 404), 502 (corresponding to portion 406) located proximate to each other, each comprising inner and outer measurement locations (again indicated by arrows). In this example, separate inner gauge and outer gauges are used as their measured portions are different process layers. In this example, portion 404 is biased larger by two different amounts 504, 506, and also biased smaller 508. Portion 406 is biased larger by two different amounts 510, 512, and also biased smaller 514. As shown in FIG. 5, bias amount 506 may be subtracted from bias amount 504 to create a mask 520. Bias amount 506 may be used as and/or to define a mask. Bias amount 508 may be subtracted from bias amount 504 to create a mask 522. Bias amount 512 may be subtracted from bias amount 510 to create a mask 524. Bias amount 512 may be used as and/or to define a mask. Bias amount 514 may be subtracted from bias amount 510 to create a mask 526. These masks may be combined in different ways (e.g., as shown with the arrows, and the "+" and "−" symbols) to block one portion or another of a given pattern. In this example, the masks may be combined in different ways as shown to facilitate measurement 530 the outer gauge 500 of portion 404 (by blocking other portions of the combined gauge 500, 502 pattern), facilitate measurement 532 of the inner gauge 500 of portion 404, facilitate the measurement 534 of the outer gauge 502 of portion 406, or facilitate measurement 536 of the inner gauge 502 of portion 406.

Figure 6:
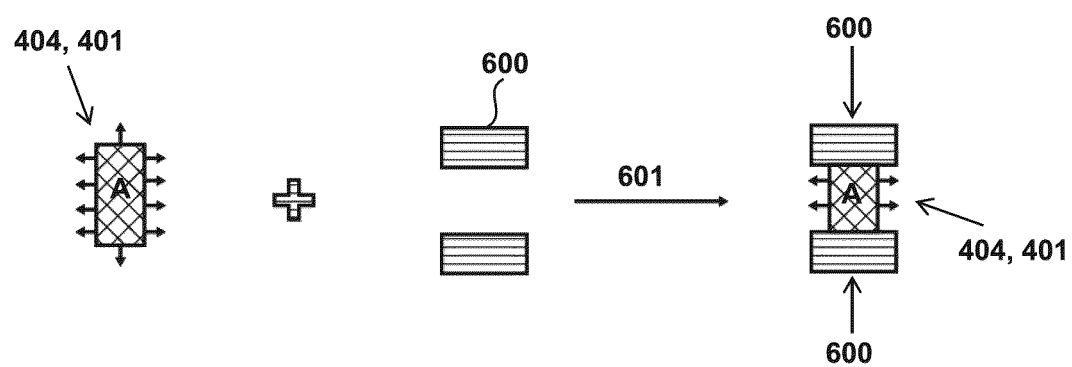
FIG. 6 illustrates using a cutting layer as a block mask to block a portion of a pattern, according to an embodiment.

In some embodiments, at least a portion of a mask is formed for a cutting layer of the pattern. For example, in an advance semiconductor node, it may create simple long lines which are later cut into smaller lines to construct complicated structures. A cut layer is needed for this cut process. By way of a non-limiting example, FIG. 6 illustrates using 601 a cutting layer 600 as a block mask to block a portion 404 of a pattern. In this example, the portion of the pattern is a seed gauge 401 from portion 404. As shown in FIG. 6, cutting layer 600 is used to block the ends of seed gauge 401 such that metric measurements are made only from a middle portion of seed gauge 401 (e.g., as indicated by the leftover remain arrows that are not covered by cutting layer 600).

Figure 7:
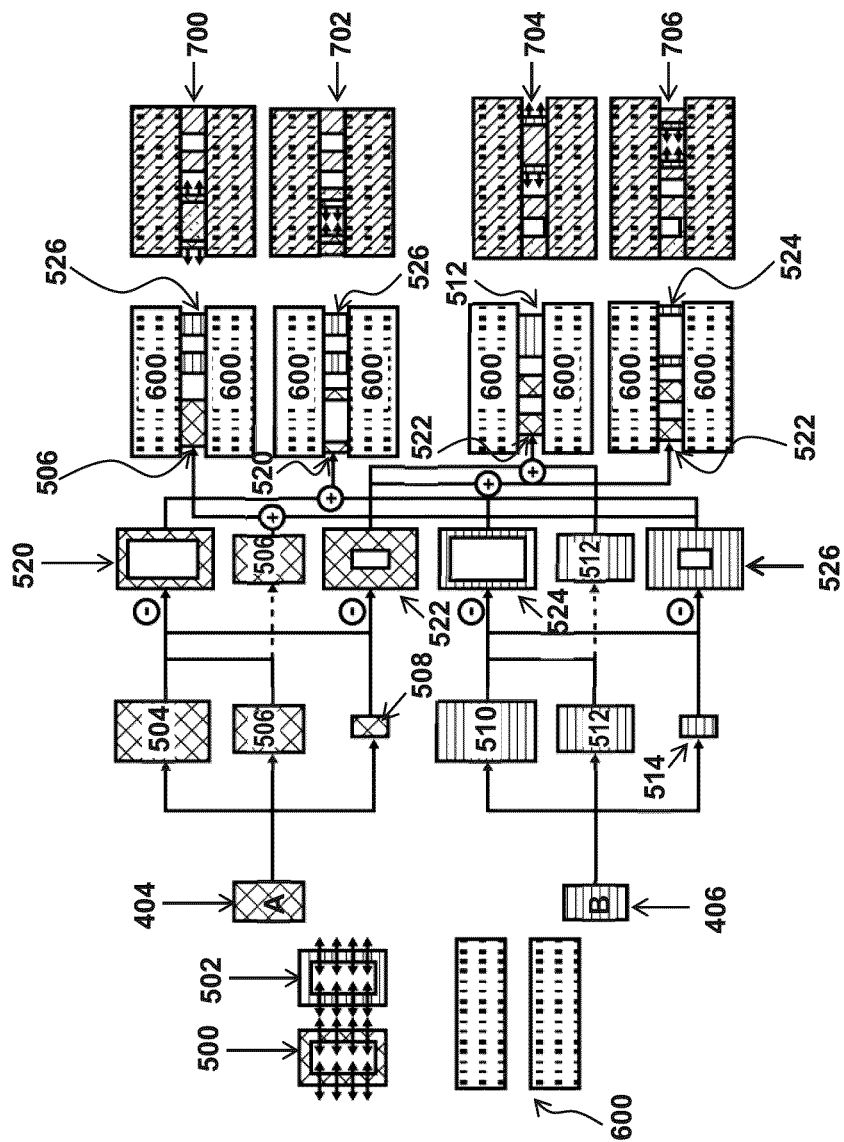
FIG. 7 illustrates using a cutting layer in combination with creating masks of various shapes by biasing the geometry of portions of a pattern in various ways as shown in FIG. 5, according to an embodiment.

As another example, FIG. 7 illustrates using a cutting layer 600 in combination with creating masks of various shapes by biasing the geometry of first and second portions 404, 406 of a pattern in various ways as shown in FIG. 5. In the example shown in FIG. 7, the masks may be combined in different ways as shown to facilitate measurement 700 of a cut portion of the outer gauge 500 of portion 404 (by blocking other portions of the combined gauge 500, 502 pattern), facilitate measurement 702 of the inner gauge 500 of portion 404, facilitate the measurement 704 of the outer gauge 502 of portion 406, or facilitate measurement 706 of the inner gauge 502 of portion 406. As shown in FIG. 7, cutting layer 600 is used to block the ends of seed gauges 500 and 502 such that metric measurements are made only from a middle portion of seed gauge 500 or 502 (e.g., as indicated by the leftover remain arrows that are not covered by cutting layer 600).

Returning to FIG. 3, determining 306 includes determining the one or more metrics for an unblocked (e.g., second) portion of the pattern. The one or more metrics comprise a critical dimension, an edge placement and/or edge placement error, overlay, line edge roughness, and/or other metrics. In some embodiments, determining the one or more metrics for the unblocked portion comprises: aligning and averaging images of the pattern on the substrate; performing contour extraction on an averaged image; and aligning an extracted contour with the pattern information for the pattern on the substrate. Determining the one or more metrics for the unblocked (e.g., second) portion further comprises: generating one or more gauges in the contour for the unblocked portion of the pattern; and measuring the one or more gauges. These operations are illustrated in FIG. 8 and further described below.

Figure 8:
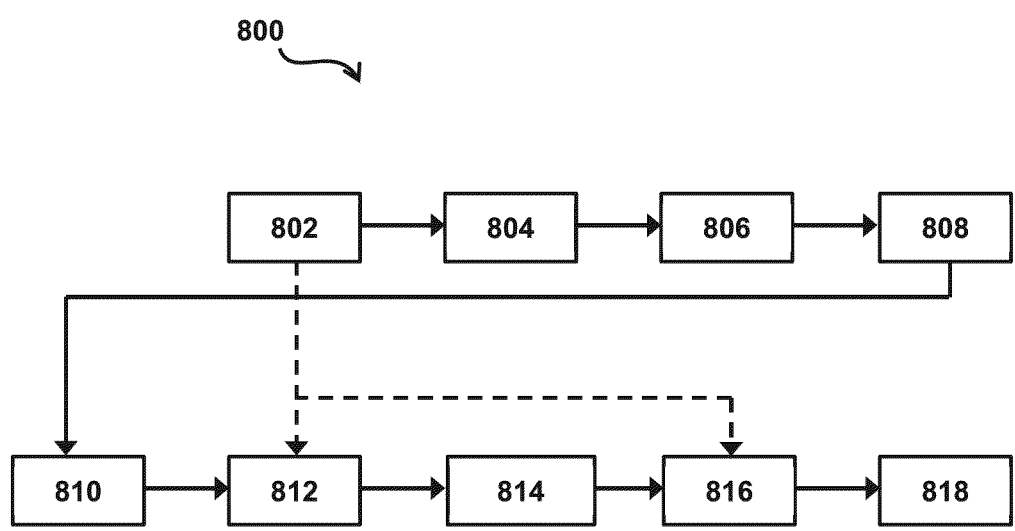
FIG. 8 illustrates an automated work flow for determining one or metrics for an unblocked portion of a pattern, according to an embodiment.

FIG. 8 illustrates an automated work flow 800 for determining one or metrics for an unblocked portion of a pattern (e.g., in an MPT process). Determining operation 306 (FIG. 3) may include some or all of the steps of work flow 800. However, work flow 800 may also include other steps included in other operations described herein. Work flow 800 begins with a layermap generation step 802. Layermap generation step 802 may comprise at least portions of receiving 302 and blocking 304 operations described above. For example, layermap generation step 802 may include generating geometrical block masks for given portions (e.g., the first portion, second portion, etc.) of a pattern based on the pattern information and/or other information. This may include biasing and/or adding/subtracting the pattern geometry as described herein to facilitate mask generation and blocking.

Work flow 800 continues with raw image processing 804. The images are scanning electron microscope (SEM) images, optical images and/or other signals or data that can be generated by a metrology or inspection system. For example, the SEM images may be actual or simulated SEM images. The SEM images comprise multiple images of given merged (e.g., first and second) repeating portions of the pattern on the substrate. As work flow 800 continues, determining the one or more metrics for the unblocked second portion comprises decomposing the merged (e.g., first and second) portions of the pattern in the SEM images. Raw image processing 804 may comprise filtering, noise reduction, cropping, flipping, rotating, and/or other raw image processing operations.

Work flow 800 includes an image alignment step 806. Alignment step 806 may comprise identifying common features throughout the SEM images and aligning the images based on the common features. For example, corresponding edges, lines, corners, metrology targets, and/or other features in the images may be identified. The images may be oriented and/or otherwise positioned relative to each other based on the identified features such that common features are oriented and/or positioned in the same way in the different images.

The aligned images may be averaged at step 808. Averaging the aligned images may produce a single representative image of the pattern in the SEM images. Averaging the aligned images may further reduce image noise and facilitate contour extraction from the averaged image, and/or have other purposes.

Contour extraction 810 may comprise identifying contours of pattern features in the averaged image. A contour may be a trace of edges of features of a pattern, for example, and/or other contours. Other portions of the images may be discarded, for example, such that a clear representation of the pattern in the images is obtained.

At step 812, the extracted contour is aligned to the pattern information. In some embodiments, the aligning is performed for substantially all of the portions of the pattern, including the blocked portion(s) and the unblocked portion(s) (e.g., the first and second portions). As described above, the pattern information specifies the geometry of the different pattern designs of the different portions of the pattern. The geometry may include feature shapes, feature dimensions, feature locations in a pattern, spacing between features, relative positions of features, etc., and/or other characteristics of the different pattern designs. The pattern information may be and/or include a GDS file that specifies the geometry of the individual portions of the pattern, and/or other types of information, for example. Contour shapes, contour dimensions, spacing between contour features, relative positions of contour features, etc., and/or other characteristics of the extracted contour may be aligned with the feature shapes, feature dimensions, feature locations in a pattern, spacing between features, relative positions of features, etc., and/or other characteristics of the different pattern designs described in the pattern information. In some embodiments, for example, step 812 may comprise converting a coordinate system from an image pixel based coordinate system to GDS coordinates, and/or other operations.

At step 814, the extracted contour may be adjusted. The contour adjustment may comprise sharpening and/or otherwise enhancing portions of the contour. For example, portions of the extracted contour that have gaps, appear vague, appear disjointed, etc. may be adjusted (e.g., have the gaps filled in, lines smoothed, etc.) such that the contour forms a sharpened, clean, substantially continuous representation of a pattern.

Finally, work flow 800 comprises generating 816 gauges and then measuring 818 the gauges. Gauges may specify the one or more metrics. Generating a gauge may comprise specifying measurement locations in the extracted contour for measurement. For example, a given metric may be a spacing between two different features. Generating a corresponding gauge may comprise identifying the edges of the two different features and determining that a distance between the two edges should be measured. As another example, a given metric may be the location or the placement of the edge of a feature (e.g., the absolute position, the position of the edge relative to other features, etc.) Generating a corresponding gauge may comprise identifying the edge of the feature and determining that the position of the edge should be measured. In some embodiments, measuring 818 the gauges comprises causing a metrology apparatus to determine the distances, positions, etc. specified by the gauges. In some embodiments, measuring 818 the gauges comprises determining the distances, positions, etc. based on properties of the extracted contour (e.g., performing measurements electronically directly in or based on a contour image), and/or other determinations. In some embodiments, measuring 818 may be performed using a model generated based on the extracted contour, and/or in other ways.

As shown in FIG. 8, layermap generation 802 (e.g., the generated block masks) may be used in steps 812 and 816 to generate the gauges for the unblocked portion of the pattern. In this way, the one or more gauges may specify the one or more metrics for the unblocked portion. For example, step 816 may comprise excluding blocked portions of a pattern and only generating gauges for the unblocked portions of the pattern. In step 812, converting a coordinate system from an image pixel based coordinate system to GDS coordinates was performed. A determination of which gauges are within a block mask region may be made based on the converted coordinates.

Figure 9:
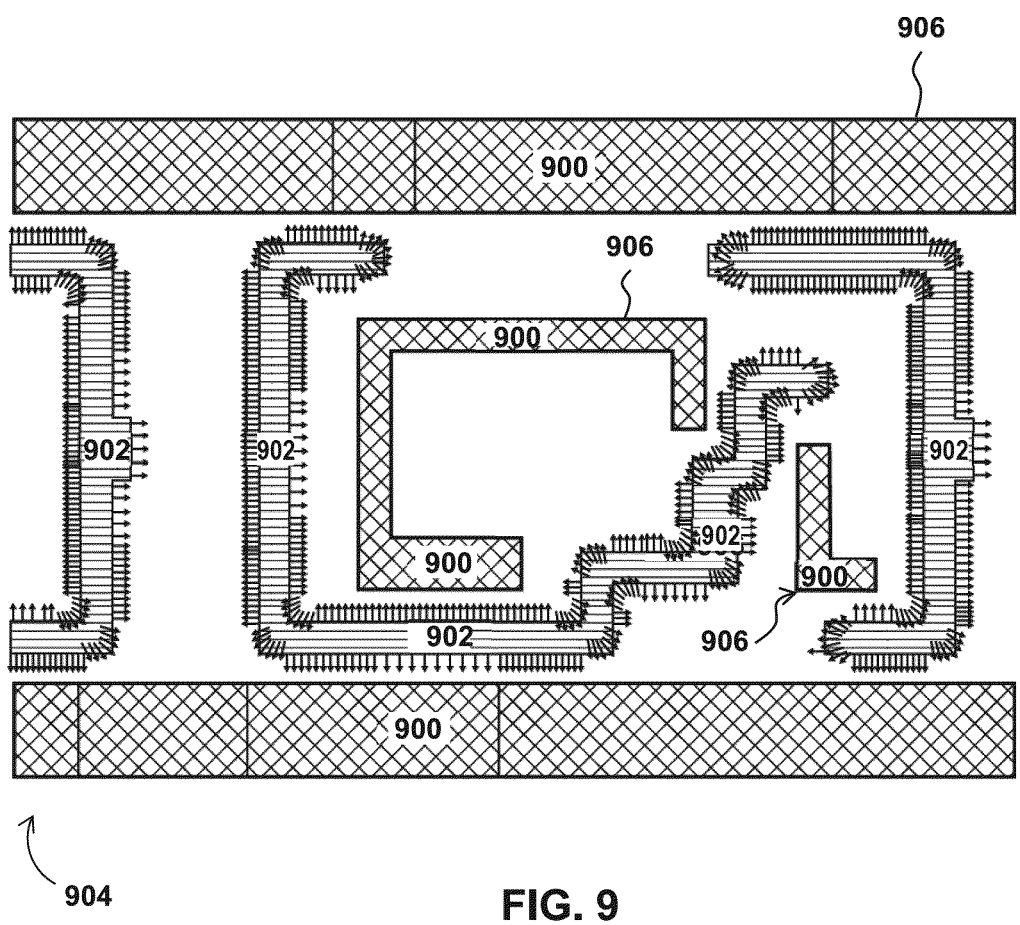
FIG. 9 illustrates an example of a blocked first portion of a pattern, and an unblocked second portion of a pattern, according to an embodiment.
Figure 10:
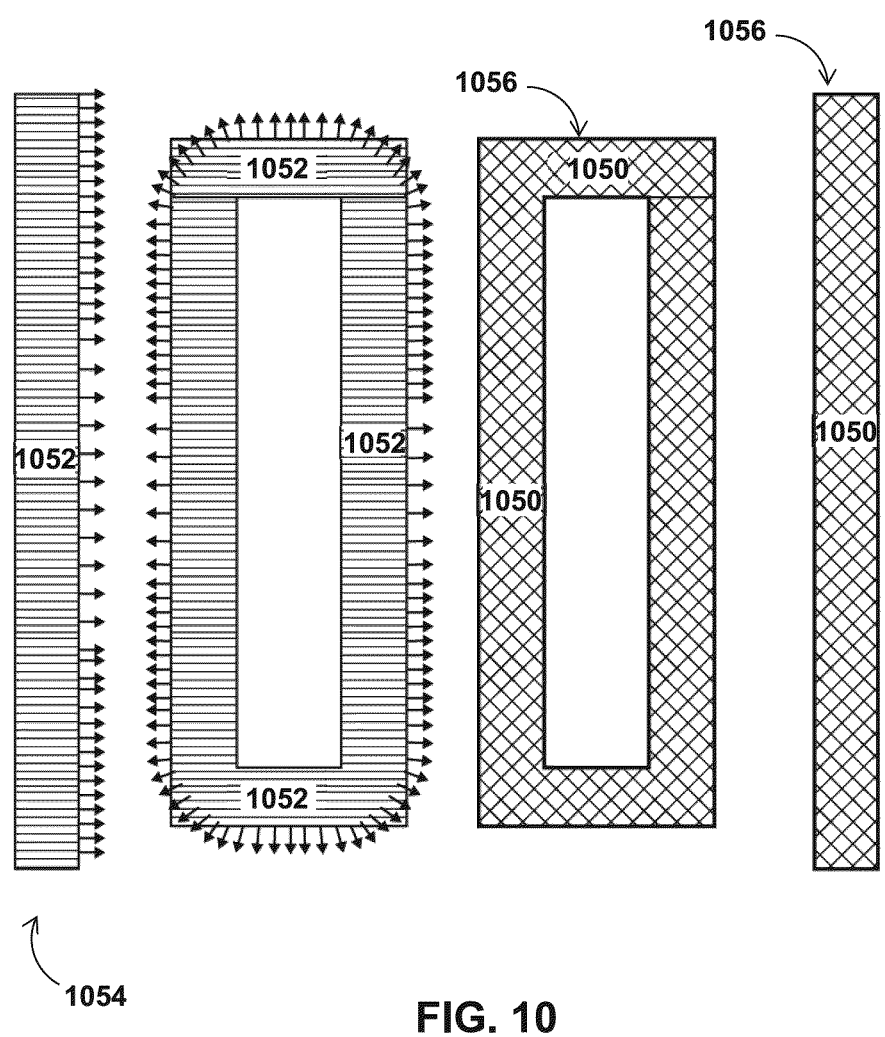
FIG. 10 illustrates another example of a blocked first portion of a pattern, and an unblocked second portion of a pattern, according to an embodiment.

FIGS. 9 and 10 illustrate examples of a blocked first portion of a pattern, and an unblocked second portion of a pattern according to an embodiment of the present disclosure. FIG. 9 illustrates blocked first portion 900, and unblocked second portion 902. Portions 900 and 902 comprise merged portions of an overall pattern 904. For example, portions 900 and 902 are located in proximity to each other and features of different portions 900, 902 are positioned between, inside, and/or around one or more features of another portion 900, 902 of the pattern. As shown in FIG. 9, several measurement locations (e.g., gauges) have been identified for unblocked portion 902 as indicated by the arrow heads across portion 902. In contrast, no measurement locations have been identified for portion 900. This is because portion 900 has been masked by a mask 906. In this example, mask 906 comprises geometry of portion 900 that has been biased larger such that portion 900 and any corresponding measurement locations for portion 900 are blocked by mask 906. This facilitates accurate measurements for portion 902 (e.g., features of portion 900 will not accidentally be measured because they are blocked by mask 906).

FIG. 10 illustrates blocked first portion 1050, and unblocked second portion 1052. Portions 1050 and 1052 comprise merged portions of an overall pattern 1054. For example, portions 1050 and 1052 are located in proximity to each other. As shown in FIG. 10, several measurement locations (e.g., gauges) have been identified for unblocked portion 1052 as indicated by the arrow heads across portion 1052. In contrast, no measurement locations have been identified for portion 1050. This is because portion 1052 has been masked by a mask 1056. In this example, mask 1056 comprises geometry of portion 1050 that has been biased larger such that portion 1050 and any corresponding measurement locations for portion 1050 are blocked by mask 1056. This facilitates accurate measurements for portion 1052 (e.g., features of portion 1050 will not accidentally be measured because they are blocked by mask 1056).

Figure 11:
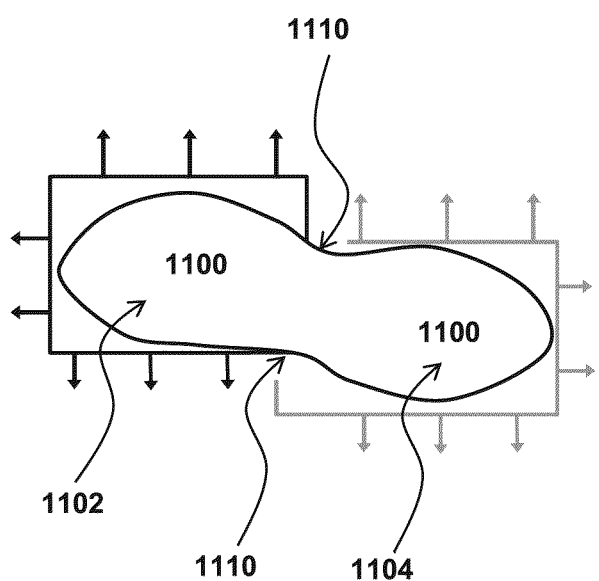
FIG. 11 illustrates a merged pattern feature comprising two different portions of a pattern, according to an embodiment.

FIG. 11 illustrates a merged pattern feature 1100 comprising two different portions 1102, 1104 of a pattern. As described above, compared to typical measurement methods, the present methods are configured to facilitate determination of both CD and EP. In an MPT process, it can be difficult to measure CD at some positions. For example, at position 1110 shown in FIG. 11, CD/EP cannot be measured because portions 1102 and 1104 overlap to form feature 1100. There is overlap between polygons from two different portions 1102, 1104 of the pattern. In this situation, CD/EP is not attributed to a single portion of the mask pattern. The present method will exclude measurement in region 1110. For example, using the present method, pattern information for the pattern is received, a first portion (e.g., portion 1102) of the pattern is blocked based on the pattern information such that a second portion (e.g., portion 1104) of the pattern remains unblocked, and EP for the unblocked second portion of the pattern is determined, and vice versa.

Returning to FIG. 3, adjusting 308 comprises adjusting a semiconductor manufacturing process, a process simulation model, or an OPC model based on the one or more metrics for individual portions of a pattern that are obtained by using the blocking masks as described above. In some embodiments, adjusting 308 comprises changing a dimension, a shape, and/or a location of a feature in the pattern in a mask design, e.g., based on measured metrics of an unblocked portion; or changing a mask, a dose, a focus, and/or an exposure associated with the unblocked portion of the pattern, and/or other adjusting. In some embodiments, adjusting 308 comprises performing OPC based on the one or more metrics for the unblocked portion of the pattern.

In some embodiments, adjusting 308 includes first determining an actual adjustment. This may be an amount or value for a dimensional change, a shape change, a location change, a dose change, an exposure change, etc. Alternatively and/or in addition, the determined adjustment may be communicated to a different system and/or to a user, and/or used in other operations, without performing any actual adjusting. This may take the form of a recommendation and/or suggestion, for example, and/or other forms. Such a recommendation and/or suggestion may be communicated to a user via a user interface, for example, electronically communicated to a different system, and/or communicated in other ways.

In some embodiments, operation 308 includes determining one or more adjustments for a device pattern, a mask pattern, the projection optics, the illumination source, and/or other components. The pattern(s), the projection optics, the illumination source, and/or the other components may be adjusted until a termination condition is satisfied, for example. In some embodiments, the termination condition comprises a determination that features patterned onto the substrate (e.g., physically and/or in an electronic model) substantially match a target design. In some embodiments, adjustments may be iterative adjustments of the device pattern, mask pattern, parameters of the illumination source, parameters of the projection optics, and/or other iterative adjustments, for example. The iterative adjustments may continue until the termination condition is satisfied (e.g., until one or more features patterned on a substrate adequately match a target design). In some embodiments, adjustments of the pattern include adjustments of design variables (e.g., feature dimensions, locations, etc.; adding and/or subtracting assist features; etc.). Adjustments of the parameters of the illumination source include adjustments of a dose, a wavelength, an intensity, and/or other parameters of the illumination. Adjustments of the parameters of the projection optics may include pupil adjustments, adjusting a slit, and/or other parameters of the projection optics.

In some embodiments, the iterative adjustment of the pattern, parameters of the illumination source, parameters of the projection optics, and/or other iterative adjustments until a termination condition is satisfied is performed without constraints restricting ranges of possible values of the tunable variables. In some embodiments, the iterative adjustment of patterns, parameters of the illumination source, parameters of the projection optics, and/or other iterative adjustments until a termination condition is satisfied is performed with at least one constraint (e.g., a critical dimension, a minimum line width, a minimum spacing between curved shapes, etc.) restricting a range of possible values of at least one tunable variable. In some embodiments, the at least one constraint is associated with one or more of physical characteristics of a mask and/or fabricating the mask, physical characteristics of a lithographic projection apparatus, or dependence of a design variable (e.g., curvature of a segment of a first feature) on one or more other design variables (e.g., curvature of a related segment of a second feature).

Figure 12:
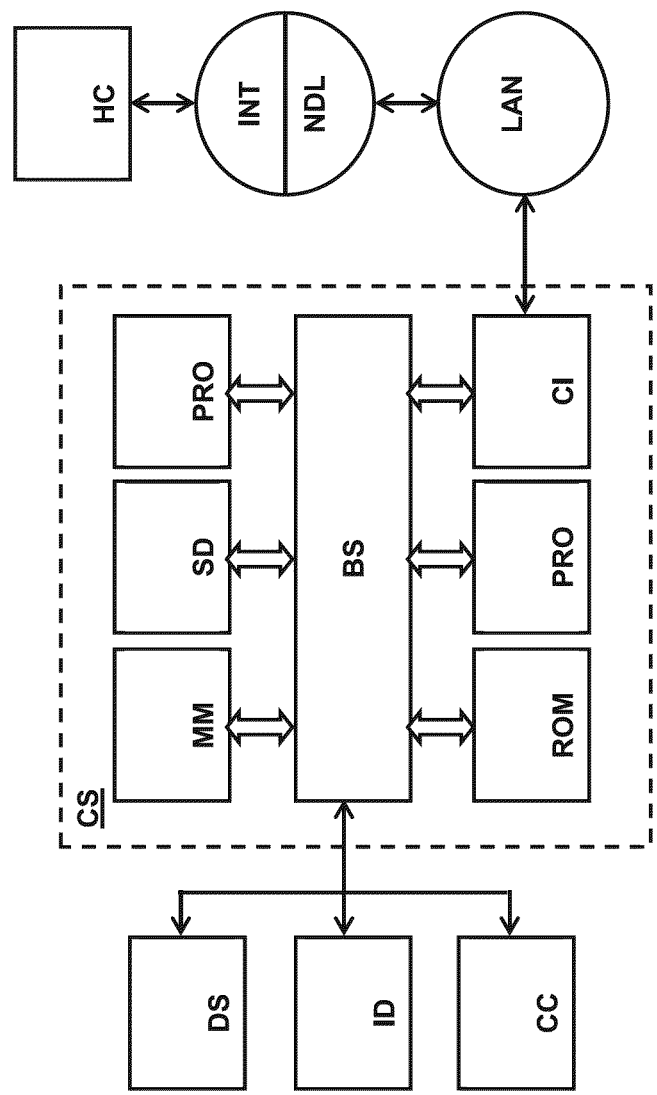
FIG. 12 is a block diagram of an example computer system, according to an embodiment.

FIG. 12 is a diagram of an example computer system CS that may be used for one or more of the operations described herein. Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) may use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 13:
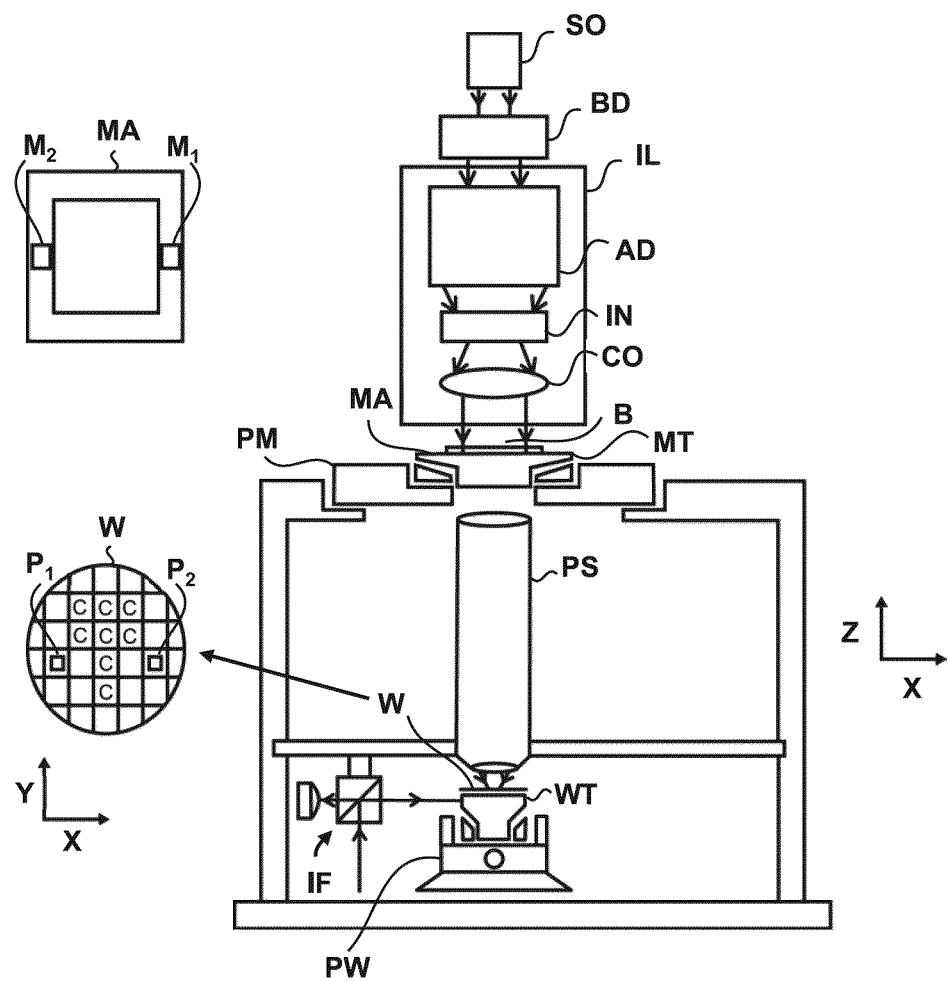
FIG. 13 is a schematic diagram of a lithographic projection apparatus, according to an embodiment.

FIG. 13 is a schematic diagram of a lithographic projection apparatus, according to an embodiment. The lithographic projection apparatus may be associated with one or more of the operations described herein. For example, a verified mask design may be used for a mask that is removably coupled with the lithographic projection apparatus. The lithographic projection apparatus can include an illumination system IL, a first object table MT, a second object table WT, and a projection system PS. Illumination system IL, can condition a beam B of radiation. In this example, the illumination system also comprises a radiation source SO. First object table (e.g., a patterning device table) MT can be provided with a patterning device holder to hold a patterning device MA (e.g., a mask or reticle), and connected to a first positioner to accurately position the patterning device with respect to item PS. Second object table (e.g., a substrate table) WT can be provided with a substrate holder to hold a substrate W (e.g., a resist-coated silicon wafer), and connected to a second positioner to accurately position the substrate with respect to item PS. Projection system (e.g., which includes a lens) PS (e.g., a refractive, catoptric or catadioptric optical system) can image an irradiated portion of the patterning device MA onto a target portion C (e.g., comprising one or more dies) of the substrate W. Patterning device MA and substrate W may be aligned using patterning device alignment marks M1, M2 and substrate alignment marks P1, P2, for example.

As depicted, the apparatus can be of a transmissive type (i.e., has a transmissive patterning device). However, in general, it may also be of a reflective type, for example (with a reflective patterning device). The apparatus may employ a different kind of patterning device for a classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander, or beam delivery system BD (comprising directing mirrors, the beam expander, etc.). for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus. The radiation beam that it produces may be led into the apparatus (e.g., with the aid of suitable directing mirrors), for example. This latter scenario can be the case when source SO is an excimer laser (e.g., based on KrF, ArF or F2 lasing), for example.

The beam B can subsequently intercept patterning device MA, which is held on a patterning device table MT. Having traversed patterning device MA, the beam B can pass through the lens PL, which focuses beam B onto target portion C of substrate W. With the aid of the second positioning means (and interferometric measuring means IF), the substrate table WT can be moved accurately, e.g. to position different target portions C in the path of beam B. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool), patterning device table MT may be connected to a short stroke actuator, or may be fixed.

The depicted tool can be used in two different modes, step mode and scan mode. In step mode, patterning device table MT is kept essentially stationary, and an entire patterning device image is projected in one operation (i.e., a single "flash") onto a target portion C. Substrate table WT can be shifted in the x and/or y directions so that a different target portion C can be irradiated by beam B. In scan mode, essentially the same scenario applies, except that a given target portion C is not exposed in a single "flash." Instead, patterning device table MT is movable in a given direction (e.g., the "scan direction", or the "y" direction) with a speed v, so that projection beam B is caused to scan over a patterning device (e.g., mask) image. Concurrently, substrate table WT is simultaneously moved in the same or opposite direction at a speed V=Mv, in which M is the magnification of the lens (typically, M=1/4 or 1/5). In this manner, a relatively large target portion C can be exposed, without having to compromise on resolution.

Figure 14:
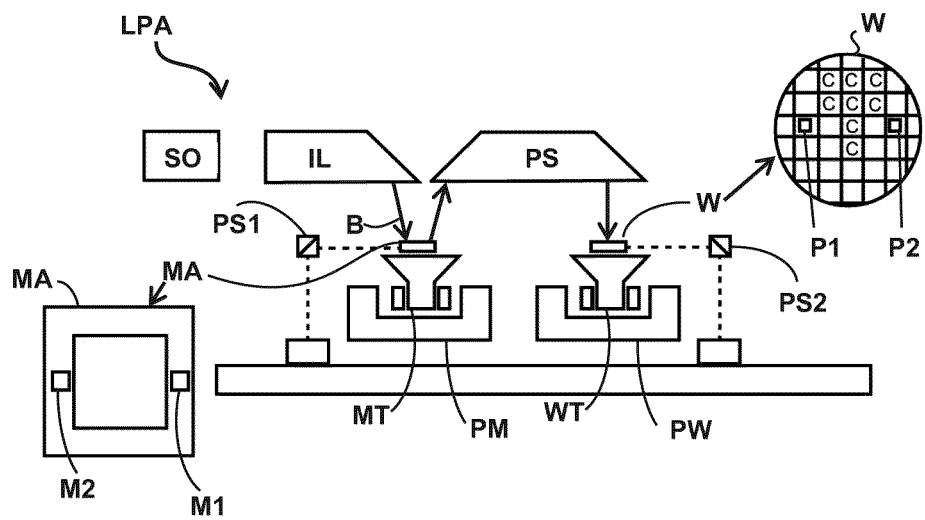
FIG. 14 is a schematic diagram of another lithographic projection apparatus, according to an embodiment.

FIG. 14 is a schematic diagram of another example lithographic projection apparatus (LPA) that may be used for, and/or in conjunction with, one or more of the operations described herein. LPA can include source collector module SO, illumination system (illuminator) IL configured to condition a radiation beam B (e.g. EUV radiation), support structure MT, substrate table WT, and projection system PS. Support structure (e.g. a patterning device table) MT can be constructed to support a patterning device (e.g. a mask or a reticle) MA and connected to a first positioner PM configured to accurately position the patterning device. Substrate table (e.g. a wafer table) WT can be constructed to hold a substrate (e.g. a resist coated wafer) W and connected to a second positioner PW configured to accurately position the substrate. Projection system (e.g. a reflective projection system) PS can be configured to project a pattern imparted to the radiation beam B by patterning device MA onto a target portion C (e.g. comprising one or more dies) of the substrate W.

As shown in this example, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP"), the plasma can be produced by irradiating a fuel, such as a droplet, stream or cluster of material having the line-emitting element, with a laser beam. Source collector module SO may be part of an EUV radiation system including a laser (not shown in FIG. 14), for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation. In this example, the laser may not be considered to form part of the lithographic apparatus and the radiation beam can be passed from the laser to the source collector module with the aid of a beam delivery system comprising, for example, suitable directing mirrors and/or a beam expander. In other examples, the source may be an integral part of the source collector module, for example when the source is a discharge produced plasma EUV generator, often termed a DPP source.

Illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder, or capacitive sensor), the substrate table WT can be moved accurately (e.g. to position different target portions C in the path of radiation beam B). Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode. In step mode, the support structure (e.g. patterning device table) MT and the substrate table WT are kept essentially stationary, while an entire pattern imparted to the radiation beam is projected onto a target portion C at one time (e.g., a single static exposure). The substrate table WT is then shifted in the X and/or Y direction so that a different target portion C can be exposed. In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de)magnification and image reversal characteristics of the projection system PS. In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 15:
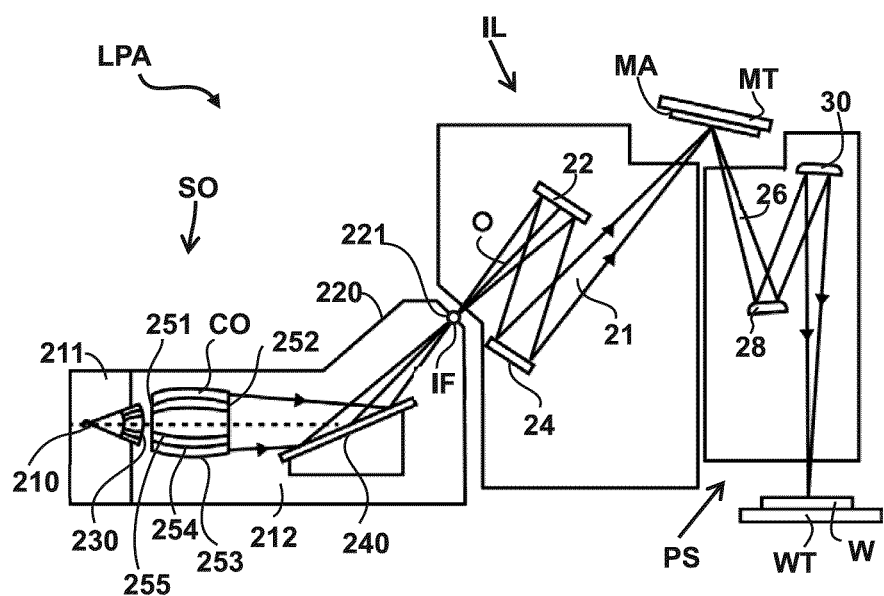
FIG. 15 is a detailed view of a lithographic projection apparatus, according to an embodiment.

FIG. 15 is a more detailed view of the lithographic projection apparatus shown in FIG. 14. As shown in FIG. 15, the LPA can include the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 (described below) also includes a channel structure. The collector chamber 212 may include a radiation collector CO which may be a grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line "O". The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT. More elements than shown may generally be present in illumination optics unit IL and projection system PS. The grating spectral filter 240 may optionally be present, depending upon the type of lithographic apparatus, for example. Further, there may be more mirrors present than those shown in the figures, for example there may be 1-6 additional reflective elements present in the projection system PS than shown in FIG. 15.

Collector optic CO, as illustrated in FIG. 15, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 16:
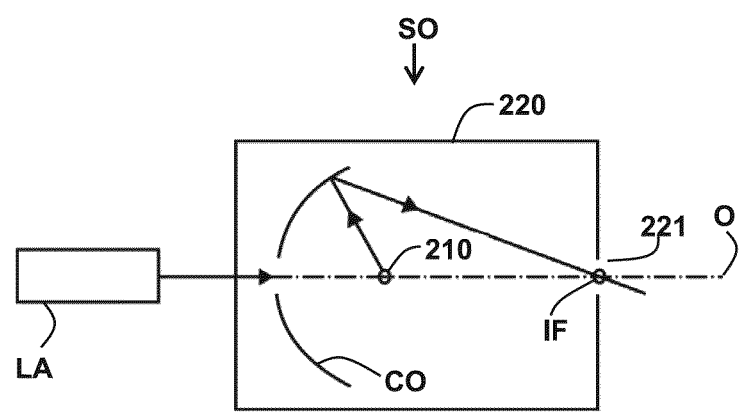
FIG. 16 is a detailed view of the source collector module of the lithographic projection apparatus, according to an embodiment.

FIG. 16 is a detailed view of source collector module SO of the lithographic projection apparatus LPA (shown in previous figures). Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Embodiments of the present disclosure can be further described by using the following clauses.

1. A non-transitory computer readable medium having instructions thereon, the instructions when executed by a computer causing the computer to perform a method of:
  receiving pattern information for a pattern on a substrate, the pattern on the substrate having first and second portions;

blocking, based on the pattern information, the first portion such that the second portion remains unblocked; and determining one or more metrics for the unblocked second portion.

2. The medium of clause 1, wherein the one or more metrics comprise a critical dimension and/or edge placement error.

3. The medium of any of clause 1 or 2, wherein determining the one or more metrics for the unblocked second portion comprises:

aligning and averaging images of the pattern on the substrate;

performing contour extraction on an averaged image; and aligning an extracted contour with the pattern information for the pattern on the substrate, the aligning performed for both portions of the pattern, including the blocked first portion and unblocked second portion.

4. The medium of clause 3, wherein determining the one or more metrics for the unblocked second portion further comprises:

generating one or more gauges in the contour for the unblocked second portion of the pattern; and measuring the one or more gauges, the one or more gauges specifying the one or more metrics for the unblocked second portion.

5. The medium of clause 3 or 4, further comprising obtaining data representing the images, wherein the first and second portions of the pattern are merged, wherein the images are scanning electron microscope (SEM) images comprising the merged first and second portions of the pattern on the substrate, and wherein determining the one or more metrics for the unblocked second portion comprises decomposing the first and second portions of the pattern in the SEM images.

6. The medium of any of clauses 1-5, wherein blocking comprises generating a geometrical block mask for the first portion based on the pattern information.

7. The medium of clause 6, wherein the pattern information specifies geometry of the first portion of the pattern, and wherein generating the mask comprises biasing the geometry of the first portion larger or smaller relative to the geometry of the first portion specified in the pattern information.

8. The medium of clause 6, wherein the pattern information specifies geometry of the first portion of the pattern, and wherein generating the mask comprises generating a first mask area by biasing the geometry of the first portion larger relative to the geometry of the first portion specified in the pattern information, generating a second mask area by biasing the geometry of the first portion smaller relative to the geometry of the first portion specified in the pattern information, and subtracting the second mask area from the first mask area to generate the mask.

9. The medium of any of clauses 6-8, wherein at least a portion of the mask is further formed by a cutting layer of the pattern.

10. The medium of any of clauses 1-9, wherein the first and second portions of the pattern on the substrate are merged and correspond to different exposures in a semiconductor lithography process.

11. The medium of clause 10, wherein the semiconductor lithography process is a multiple patterning technology process.

12. The medium of clause 11, wherein the multiple patterning technology process is a double patterning process, a triple patterning process, or a spacer double patterning process.

13. The medium of any of clauses 1-12, wherein the instructions are further configured to cause the computer to adjust a semiconductor manufacturing process based on the one or more metrics for the unblocked second portion.

14. The medium of clause 13, wherein the adjusting comprises changing a dimension, a shape, and/or a location of a feature in the second portion of the pattern; and/or changing a mask, a dose, a focus, and/or an exposure associated with the second portion of the pattern.

15. The medium of any of clauses 1-14, wherein the instructions are further configured to cause the computer to:

unblock the first portion based on the pattern information;

block, based on the pattern information, the second portion such that the first portion remains unblocked; and determine one or more metrics for the unblocked first portion.

16. A method for determining one or more metrics for a portion of a pattern on a substrate, the method comprising:

receiving pattern information for the pattern on the substrate, the pattern on the substrate having first and second portions;

blocking, based on the pattern information, the first portion of the pattern such that the second portion of the pattern remains unblocked; and determining the one or more metrics for the unblocked second portion of the pattern.

17. The method of clause 16, wherein the one or more metrics comprise a critical dimension and/or edge placement error.

18. The method of any of clauses 16 or 17, wherein determining the one or more metrics for the unblocked second portion comprises:

aligning and averaging images of the pattern on the substrate;

performing contour extraction on an averaged image; and aligning an extracted contour with the pattern information for the pattern on the substrate, the aligning performed for both portions of the pattern, including the blocked first portion and unblocked second portion.

19. The method of clause 18, wherein determining the one or more metrics for the unblocked second portion further comprises:

generating one or more gauges in the contour for the unblocked second portion of the pattern; and measuring the one or more gauges, the one or more gauges specifying the one or more metrics for the unblocked second portion.

20. The method of any of clauses 18 or 19, wherein the first and second portions of the pattern are merged, wherein the images are scanning electron microscope (SEM) images comprising the merged first and second portions of the pattern on the substrate, and wherein determining the one or more metrics for the unblocked second portion comprises decomposing the first and second portions of the pattern in the SEM images.

21. The method of any of clauses 16-20, wherein blocking comprises generating a geometrical block mask for the first portion based on the pattern information.

22. The method of clause 21, wherein the pattern information specifies geometry of the first portion of the pattern, and wherein generating the mask comprises biasing the geometry of the first portion larger or smaller relative to the geometry of the first portion specified in the pattern information.

23. The method of clause 21, wherein the pattern information specifies geometry of the first portion of the pattern, and wherein generating the mask comprises generating a first mask area by biasing the geometry of the first portion larger relative to the geometry of the first portion specified in the pattern information, generating a second mask area by biasing the geometry of the first portion smaller relative to the geometry of the first portion specified in the pattern information, and subtracting the second mask area from the first mask area to generate the mask.

24. The method of any of clauses 21-23, wherein at least a portion of the mask is further formed by a cutting layer of the pattern.

25. The method of any of clauses 16-24, wherein the first and second portions of the pattern are merged, and wherein the merged first and second portions of the pattern on the substrate correspond to different exposures in a semiconductor lithography process.

26. The method of clause 25, wherein the semiconductor lithography process is a multiple patterning technology process.

27. The method of clause 26, wherein the multiple patterning technology process is a double patterning process, a triple patterning process, or a spacer double patterning process.

28. The method of any of clauses 16-27, further comprising adjusting a semiconductor manufacturing process based on the one or more metrics for the unblocked second portion.

29. The method of clause 28, wherein the adjusting comprises changing a dimension, a shape, and/or a location of a feature in the second portion of the pattern; and/or changing a mask, a dose, a focus, and/or an exposure associated with the second portion of the pattern.

30. The method of any of clauses 16-29, further comprising:
unblocking the first portion, based on the pattern information;
blocking, based on the pattern information, the second portion such that the first portion remains unblocked; and
determining, one or more metrics for the unblocked first portion.

31. The medium of clauses 1-15, wherein the blocking comprises generating a geometrical block mask based on D2DB alignment.

32. The method of clauses 21-30, wherein the blocking comprises generating a geometrical block mask based on D2DB alignment.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers. In addition, the combination and sub-combinations of disclosed elements may comprise separate embodiments. For example, blocking a single portion of a pattern may form its own embodiment, or it may be included with one or more other embodiments that also include blocking other portions of a pattern, as described herein.

The descriptions above are intended to be illustrative, not limiting. Thus, it will be apparent to one skilled in the art that modifications may be made as described without departing from the scope of the claims set out below.

The invention claimed is:

1. A non-transitory computer readable medium having instructions therein or thereon, the instructions, when executed by a computer system, configured to cause the computer system to at least:
receive pattern information for a device-type pattern on a substrate, the pattern on the substrate having first and second portions;
block, based on the pattern information, the first portion such that the second portion remains unblocked; and
determine one or more metrics for the unblocked second portion.

2. The medium of claim 1, wherein the one or more metrics comprise a critical dimension and/or edge placement error.

3. The medium of claim 1, wherein the instructions configured to cause the computer system to determine the one or more metrics for the unblocked second portion are further configured to cause the computer system to:
align and average images of the pattern on the substrate;
perform contour extraction on an averaged image; and
align an extracted contour with the pattern information for the pattern on the substrate, the alignment performed for both portions of the pattern, including the blocked first portion and unblocked second portion.

4. The medium of claim 3, wherein the instructions configured to cause the computer system to determine the one or more metrics for the unblocked second portion are further configured to cause the computer system to:
generate one or more gauges in the contour for the unblocked second portion of the pattern; and
measure the one or more gauges, the one or more gauges specifying the one or more metrics for the unblocked second portion.

5. The medium of claim 3, wherein the first and second portions of the pattern are merged, wherein the images are scanning electron microscope (SEM) images comprising the merged first and second portions of the pattern on the substrate, and wherein the instructions configured to cause the computer system to determine the one or more metrics for the unblocked second portion are further configured to cause the computer system to decompose the first and second portions of the pattern in the SEM images.

6. The medium of claim 1, wherein the instructions configured to cause the computer system to block the first portion are further configured to cause the computer system to generate a geometrical block mask for the first portion based on the pattern information.

7. The medium of claim 6, wherein the pattern information specifies geometry of the first portion of the pattern, and wherein the instructions configured to cause the computer system to generate the mask are further configured to cause the computer system to bias the geometry of the first portion larger or smaller relative to the geometry of the first portion specified in the pattern information.

8. The medium of claim 6, wherein the pattern information specifies geometry of the first portion of the pattern, and wherein the instructions configured to cause the computer system to generate the mask are further configured to cause the computer system to generate a first mask area by biasing the geometry of the first portion larger relative to the geometry of the first portion specified in the pattern information, generate a second mask area by biasing the geometry of the first portion smaller relative to the geometry of the first portion specified in the pattern information, and subtract the second mask area from the first mask area to generate the mask.

9. The medium of claim 6, wherein at least a portion of the mask is further formed by a cutting layer of the pattern.

10. The medium of claim 1, wherein the first and second portions of the pattern on the substrate are merged and correspond to different exposures in a semiconductor lithography process.

11. The medium of claim 10, wherein the semiconductor lithography process is a multiple patterning technology process.

12. The medium of claim 6, wherein the instructions configured to cause the computer system to block the first portion are further configured to cause the computer system to generate a geometrical block mask for the first portion further based on D2DB alignment.

13. The medium of claim 1, wherein the instructions are further configured to cause the computer to adjust a semiconductor manufacturing process based on the one or more metrics for the unblocked second portion.

14. The medium of claim 13, wherein the instructions configured to cause the computer system to adjust the semiconductor manufacturing process are further configured to cause the computer system to change a dimension, a shape, and/or a location of a feature in the second portion of the pattern; and/or change a mask, a dose, a focus, and/or an exposure associated with the second portion of the pattern.

15. The medium of claim 1, wherein the instructions are further configured to cause the computer to:
unblock the first portion based on the pattern information;
block, based on the pattern information, the second portion such that the first portion remains unblocked; and
determine one or more metrics for the unblocked first portion.

16. A method comprising:
receiving pattern information for a device-type pattern on a substrate, the pattern on the substrate having first and second portions;
block, by a hardware computer system and based on the pattern information, the first portion such that the second portion remains unblocked; and
determine one or more metrics for the unblocked second portion.

17. The method of claim 16, wherein the one or more metrics comprise a critical dimension and/or edge placement error.

18. The method of claim 16, wherein determining the one or more metrics for the unblocked second portion comprises:
aligning and averaging images of the pattern on the substrate;
performing contour extraction on an averaged image; and
aligning an extracted contour with the pattern information for the pattern on the substrate, the aligning performed for both portions of the pattern, including the blocked first portion and unblocked second portion.

19. The method of claim 16, wherein the blocking comprises generating a geometrical block mask for the first portion based on the pattern information.

20. The method of claim 16, further comprising adjusting a semiconductor manufacturing process based on the one or more metrics for the unblocked second portion.

* * * * *